(12) United States Patent
Seguin et al.

(10) Patent No.: US 8,351,979 B2
(45) Date of Patent: Jan. 8, 2013

(54) CAMERA AS INPUT INTERFACE

(75) Inventors: Chad G. Seguin, Morgan Hill, CA (US);
Justin Gregg, San Francisco, CA (US);
Michael M. Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 704 days.

(21) Appl. No.: 12/196,128

(22) Filed: Aug. 21, 2008

(65) Prior Publication Data
US 2010/0048241 A1    Feb. 25, 2010

(51) Int. Cl.
*H04M 1/00*    (2006.01)
(52) U.S. Cl. ............... 455/550.1; 455/556.1; 455/556.2; 455/557; 715/863
(58) Field of Classification Search ............... 455/550.1, 455/556.1, 556.2, 557; 715/863
See application file for complete search history.

(56) References Cited

U.S. PATENT DOCUMENTS

| 2006/0097983 | A1* | 5/2006 | Haggman et al. | 345/156 |
| 2008/0134102 | A1* | 6/2008 | Movold et al. | 715/863 |
| 2009/0303176 | A1* | 12/2009 | Chen et al. | 345/156 |

* cited by examiner

*Primary Examiner* — Fayyaz Alam
(74) *Attorney, Agent, or Firm* — Blakely, Sokoloff, Taylor & Zafman LLP

(57) ABSTRACT

A portable handheld electronic device contains a camera lens and accelerometer to allow a user to control voicemail and call features by swiping his finger across the camera lens and/or tapping the device. Therefore, the user can comfortably input commands into the device with a single hand and without needing to move the phone away from his ear to apply these inputs. In another embodiment, the camera lens can also be used to control navigation of the display screen or a displayed document of the device. For example, if a user wishes to shift a scrollbar for a page displayed on the screen downwards to view the bottom of the page, the user should move his finger over the camera lens in an analogous downward direction.

12 Claims, 7 Drawing Sheets

CAMERA AS INPUT INTERFACE

FIELD

An embodiment of the invention is generally related to mobile devices that have a camera function and that can detect vibrations and/or movement of the device.

BACKGROUND

Portable handheld electronic devices, such as the IPHONE multifunction device by Apple Inc., have a built-in digital camera, in addition to other functions such as cellular telephony and digital audio and video file playback. The digital camera has a lens that is located on the back side of the device (opposite from the display screen). Users can take digital photos using such a device. The photos can be stored in memory and shared by e-mailing, picture messaging, or otherwise transferring the photos to others.

Typically, the camera captures images only when the camera function is active and is in use on the mobile device. While a user is, for example, browsing the Internet or making a call with the device, the camera does not capture images and cannot take a photo. To take a photo, a user first manually selects or enables the camera function, and then points the camera lens to a scene which appears as a preview on the display screen of the mobile device. When the user then releases the shutter, the image that appears on the display screen is captured as a digital photo.

Multifunction devices also have a voicemail function that allows a user to listen to voice messages that callers leave in response to unanswered calls. The user can enter commands through a keypad or touch screen to fast forward, rewind, pause, and resume playback of voicemail messages during review. For example, while a voicemail message is playing, a user may select the number "3" on the keypad to fast forward through the message.

A call function of the device allows a user to manage telephone lines during calls. For example, using buttons on the device, a user can merge multiple calls, put a call on hold, and switch between multiple simultaneous calls. Thus, a user can initiate features such as a three-way conference call among multiple callers.

A document being displayed on a screen of the device can be navigated using a touch screen or using dedicated arrow keys next to the touch screen. For example, one can scroll through webpages of the Internet on the screen and select hyperlinks that lead to other webpages in this manner. If using a touch screen, one can navigate the screen using a finger to touch the screen directly or through the use of a stylus pen applied as a pointer to the screen.

SUMMARY

In one embodiment of the invention, one can control functions of a portable handheld electronic device by swiping a finger across a camera lens of the device. In other embodiments, the user can control voicemail functions by tapping the device, which causes the device to vibrate or move. In one embodiment, to access his voice mailbox, a user may tap the phone to cause playback of a message to pause, tap the phone again to resume playback, swipe his finger over the camera lens in one direction to fast forward playback, and swipe his finger over the camera lens in another direction to rewind playback. These actions allow the user to control functions of voicemail review without removing the device from over his ear.

In another embodiment, functions for controlling call features utilize similar user actions or motions. Features such as merging multiple calls, putting a call on hold, and switching between or among multiple simultaneous calls may be controlled by single or double (or any number of) taps of the device, as detected by an accelerometer of the device. These taps may be preprogrammed by a manufacturer, or selected and programmed by a user.

Furthermore, a user may navigate a document being shown on a display screen of the device by guiding his finger over the camera lens. While viewing the display screen, the user holds the device in the palm of his hand in a supine position. Rather than pressing or sliding directional buttons next to the screen or touching a touch screen to navigate a webpage document or contacts list, the user may move his finger over the camera lens in the direction he wishes to navigate the page. For example, gliding the finger over the camera lens in an upwards direction navigates the page in an analogous upwards direction. Doing so allows the user to easily steer the display of the device in any direction, with the same hand that holds the device.

Other embodiments are also described.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations may have particular advantages not specifically recited in the above summary.

BRIEF DESCRIPTION OF THE DRAWINGS

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

In this section, several preferred embodiments of this invention are explained with reference to the appended drawings. Whenever the shapes, relative positions and other aspects of the parts described in the embodiments are not clearly defined, the scope of the invention is not limited only to the parts shown, which are meant merely for the purpose of illustration.

Figure 1:
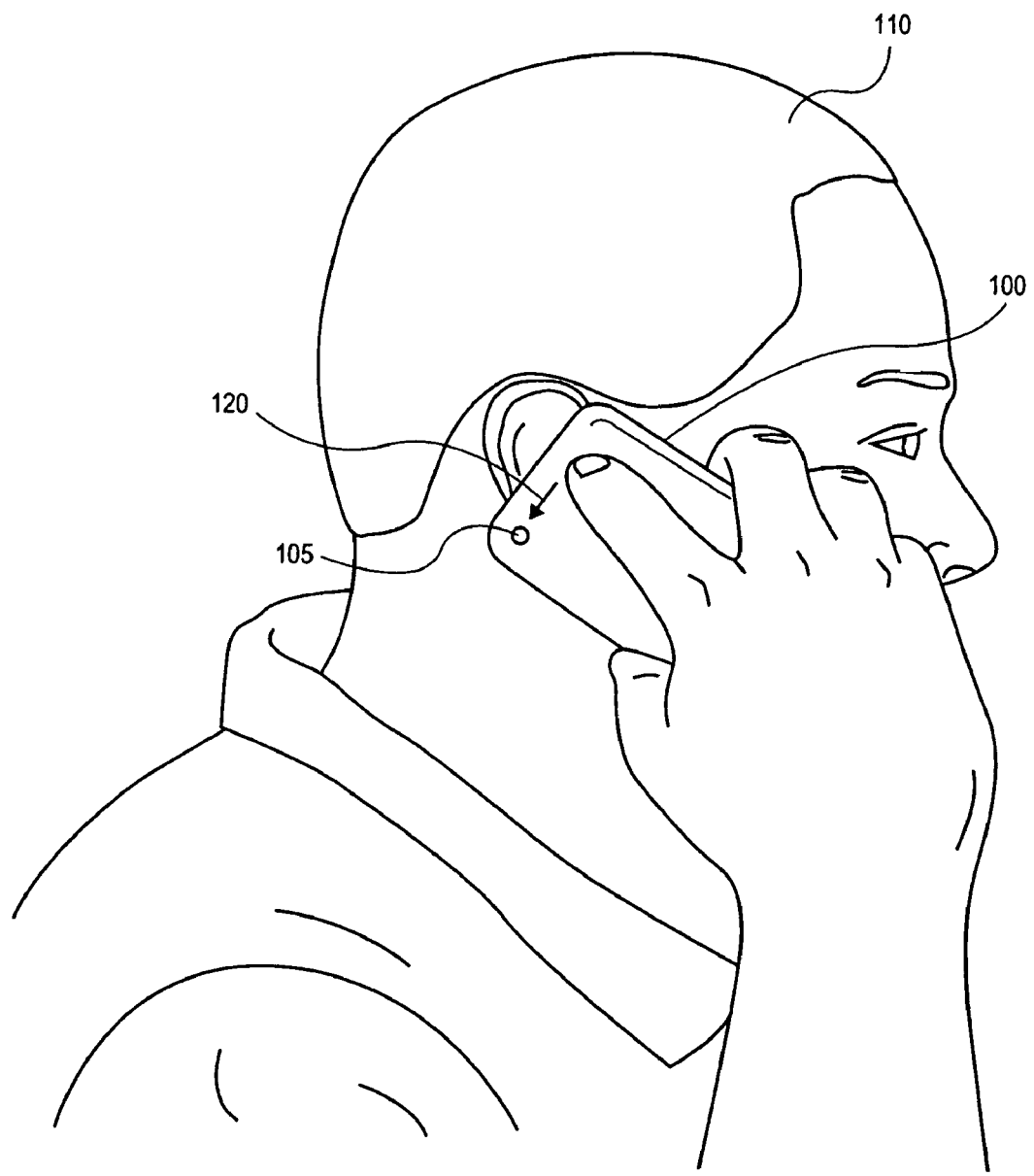
FIG. 1 shows a portable handheld device having a built-in digital camera in use for a telephone call.

FIG. 1 shows a portable handheld device 100 having a built-in digital camera in use for a telephone call or voicemail retrieval. The device 100 may be an IPHONE device by Apple Inc. of Cupertino, Calif. Alternatively, it could be any other portable handheld multi-function electronic device or smart phone that has a built-in digital camera and telephone mechanism. The device 100 may have a fixed, single piece housing like the IPHONE device, or it may have a movable, multi-piece housing such as a clamshell design or sliding keypad. The built-in digital camera includes a lens 105 located on the back face of the device 100. Although not depicted in FIG. 1, inside the device 100 are an electronic image sensor and associated hardware circuitry and running software that can capture digital images of a scene that is before the lens 105 and process those images to detect finger swipes across the lens 105. The device also has a display screen which can be used to display typical smartphone features such as visual voicemail, web browsing, email, and others.

As seen in FIG. 1, a user 110 is holding the device 100 to his ear so that he can hear the voices in a call or voicemail message. The user 110 is holding the device 100 with his right hand. However, the user 110 can alternatively hold the device 100 with his left hand (not shown). The camera lens 105 is located on the back face of the device 100 such that the user 110 can easily reach the lens 105 with a finger of the same hand that holds the device 100 in the position shown. A voicemail command can be controlled by a swipe of the finger in the direction of the arrow 120 over the lens 105. For example, during access of a voice mailbox, the user 110 may swipe his finger in the direction of the arrow 120 over the lens 105 to, for example, rewind the playback of a voicemail message. The user 110 may swipe his finger over the lens 105 in the direction opposite the arrow to fast forward the playback of a voicemail message. In general, there can be one or more different directional swipes defined as corresponding to respective voicemail commands. Note that the user need not actually touch the camera lens 105 when sliding his finger across the lens 105. In another embodiment of the invention, the user 110 may use his finger to tap the device 100, so as to pause playback of a voicemail message, or stop the rewind or fast forward of a message. While voicemail message playback is paused, the user 110 may tap the device 100 to resume playback of the voicemail message. These voicemail functions can be performed without having to move the device 100 from its position over the user's ear as depicted in FIG. 1, to in front of the user's face. Therefore, the user 110 can control voicemail playback while the device 100 is up against his ear, and without having to look for any buttons. Also, only one hand is required to implement these functions.

A similar concept may be applied to control call functions during a telephone call conversation with a called or calling party. The motions described above, namely sliding a finger in various directions across the lens 105 and tapping the device 100 with a finger, can also control call functions, such as merging multiple calls, setting a call on hold/unhold, and switching between or among multiple simultaneous calls. The setting of these motions to correspond with call control or voicemail control commands may be put into place by a manufacturer of the device 100 and/or customized by the user 110.

Figure 2:
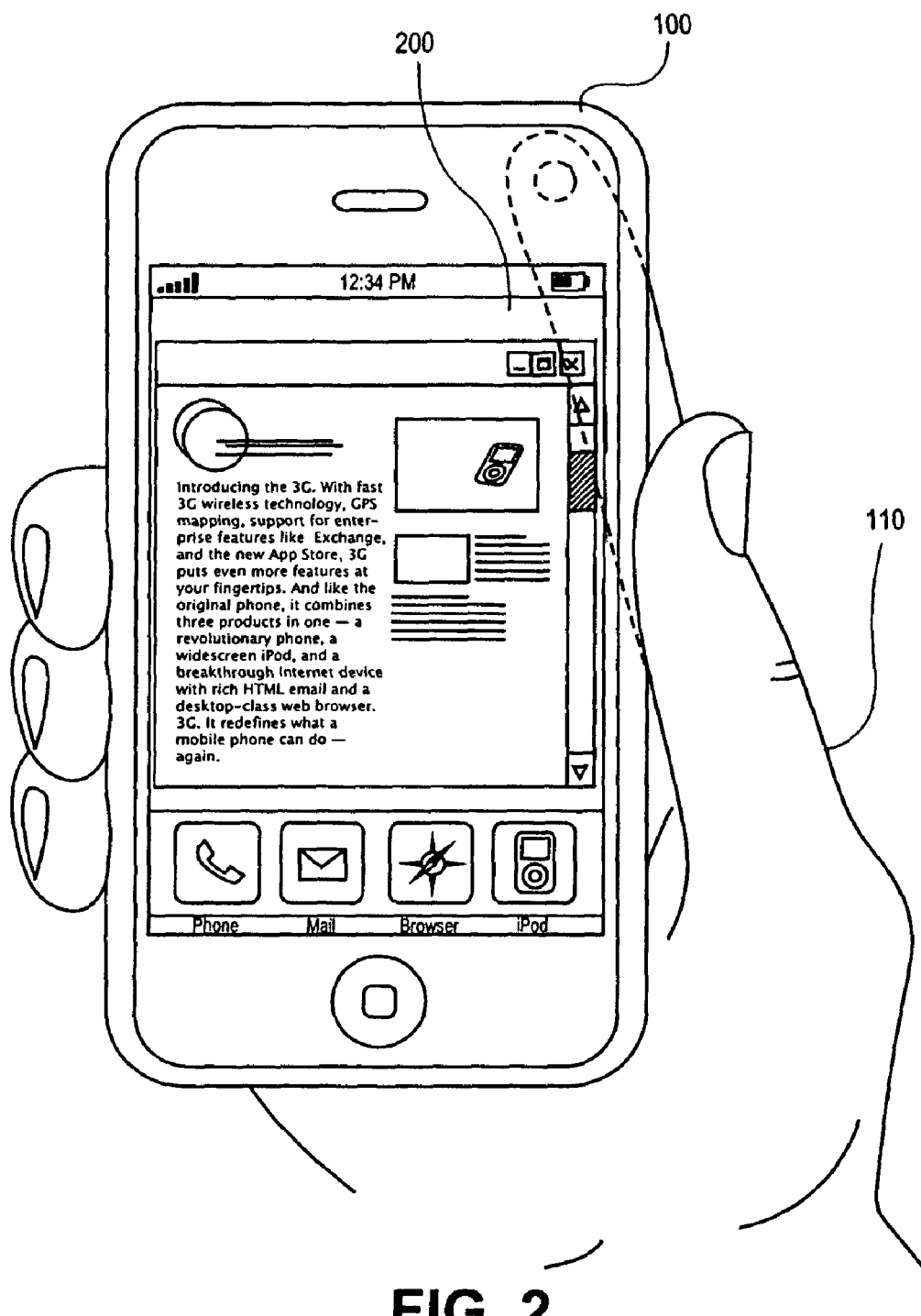
FIG. 2 shows a portable handheld device having a built-in digital camera in use for navigating the display.

Turning now to FIG. 2, this figure depicts another embodiment of the invention, as a portable handheld device 100 whose built-in digital camera is being used for navigating the display screen 200. The camera lens is again located on the back face of the device 100. The user 110 holds the device 100 in the palm of his hand so that he can view the display screen 200. To scroll or navigate a handle location or to move the view of the display screen 200, the user 110 moves his finger over the camera lens, in a direction analogous to the one that he wishes to move the handle of the screen 200. FIG. 2 depicts the user using his index finger to swipe across the lens 105, but depending on the hand that is holding the device (i.e., the right or left hand) and the location of the camera lens, a user may choose to use another finger, such as his middle or ring finger, if it would be more comfortable.

Consider the following example of navigating the display screen. If the user 110 wishes to scroll down on a webpage or text document, then the user 110 would move his finger across the camera lens in an upward direction (i.e., towards the top of the screen 200). This would be consistent with moving the page "up" so as to bring a bottom portion of the page into view. To move the page down (and thereby bring a top portion of the page into view), the reverse needs to occur, i.e., the user needs to swipe across the lens in a downward direction. Note that navigation on the display screen (using a finger swipe across the camera lens) need not be limited to straight up and down, but rather could be performed in other or additional directions (e.g. left and right).

In another embodiment, the finger swipe over a camera lens corresponds to the movement of one or more scroll bars for the page on the screen. For example, swiping a finger in the downwards direction would move an up-down scroll bar downwards, resulting in bringing the bottom portion of a page into view. Likewise, swiping a finger in the left or right direction would move a left-right scroll bar in the left or right direction, respectively (causing the left or right portion of the page into view, respectively).

Figure 3A:
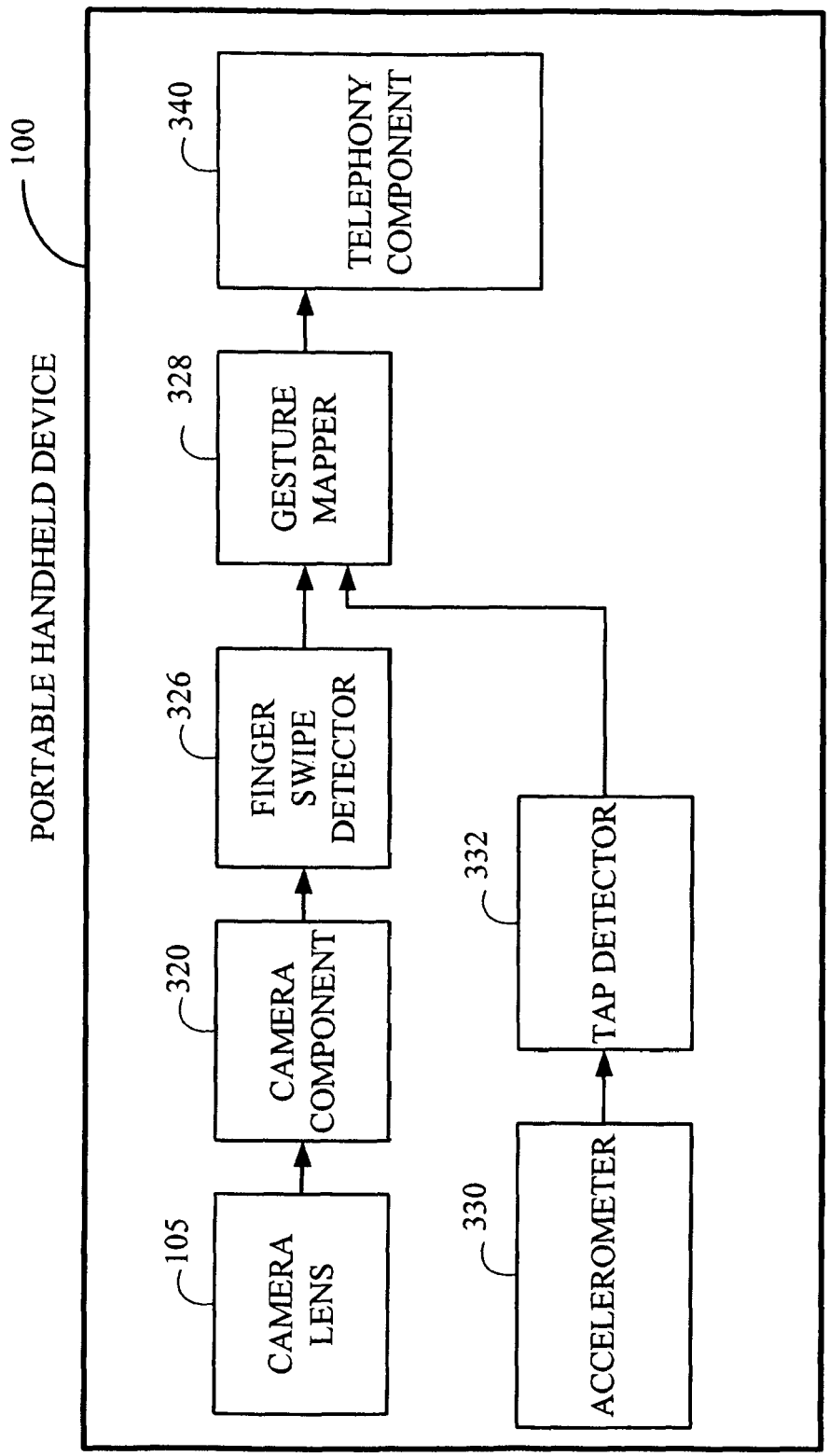
FIG. 3A is a block diagram of a portable handheld device with enhanced telephone and voicemail capabilities.

FIG. 3A is a block diagram of the portable handheld device 100 showing several of its components that enable the enhanced telephone and voicemail capabilities described above. The device 100 allows its user to swipe his finger across a camera lens or tap the device 100 to control call and voicemail commands. Different motions of the user (e.g., swiping a finger over the lens in a given direction or finger tapping the device a number of times) may translate into different commands. For example, a single tap of the device 100 translates into a different command from a double tap of the device 100.

Figure 3B:
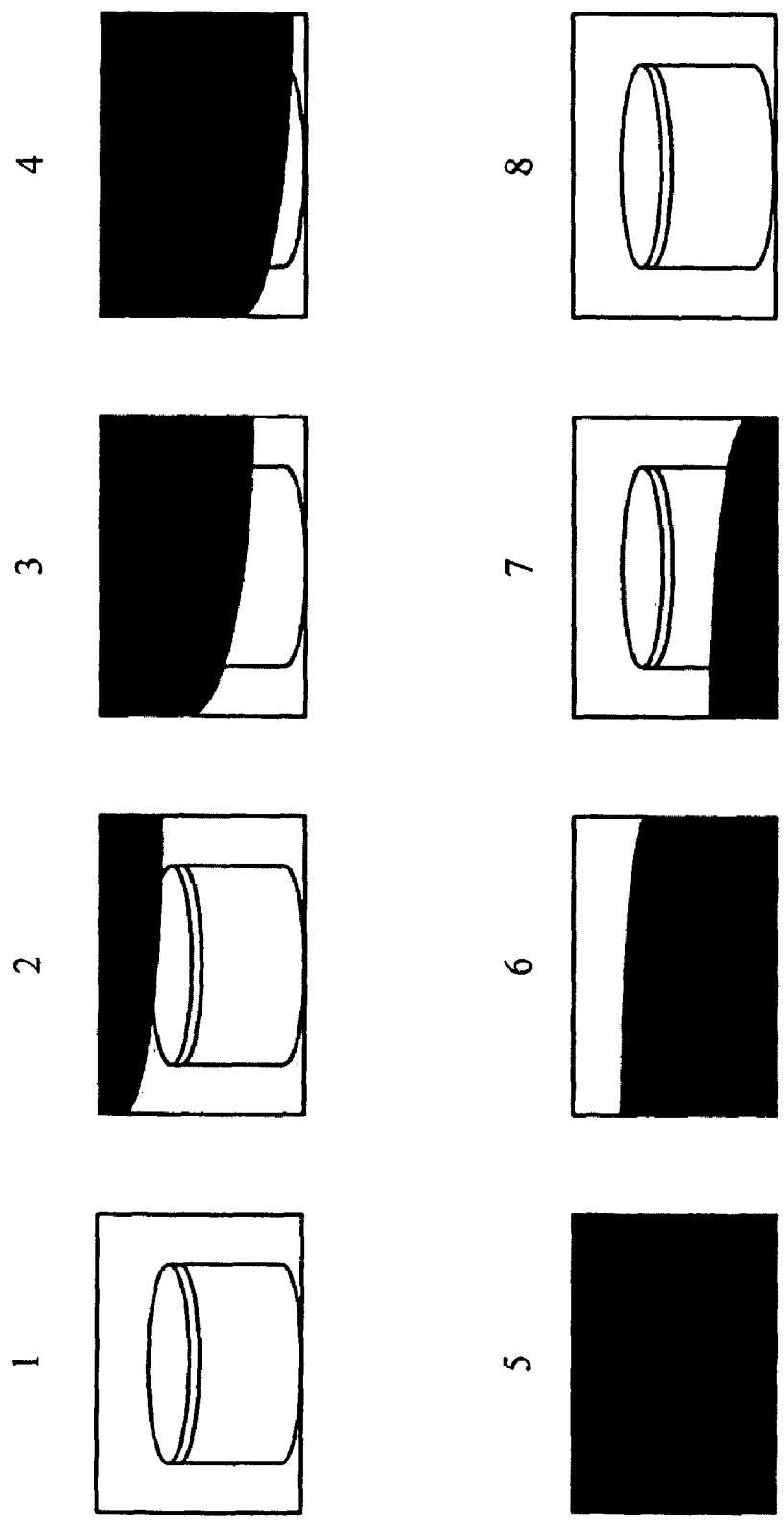
FIG. 3B illustrates an example of a captured sequence of a finger swipe.

When a user slides his finger or other object over the camera lens 105, a camera component 320 captures a sequence of images of such a finger swipe motion. A finger swipe detector 326 determines a direction of motion of the finger by analyzing the sequence of images captured by the camera component 320. For example, a downward swipe may result in the captured sequence depicted in FIG. 3B. This sequence shows the effect a downward finger swipe while the camera lens is aimed at a cup (in the background). The finger swipe detector 326 may include the needed digital image processing functions, for recognizing this pattern in an image sequence (regardless of the background content) as being that of a downward swipe.

Next, gesture mapper 328 translates that direction of motion into a predefined voicemail or call control command that is then passed to a telephony component 340. The gesture mapper 328 may translate the direction of motion into a command, by looking up the direction of motion in a database or list and identifying the corresponding command. The telephone component 340 then implements the command, e.g., invokes a call feature during an ongoing phone call, or a voicemail review feature. The mapping between a given finger swipe and a telephony command may be set by the manufacturer or it may be customized by the end user or purchaser of the device. The device 100 may be trained in an explicit or implicit manner by capturing and storing (in a library), groups of image sequences of different instances of the same swipe by the user, and then analyzing the groups of image sequences to learn the variations of what is otherwise the same finger swipe by the user. Such training may improve the accuracy of future attempts by the finger swipe detector, by adjusting to particular motions that a specific user repeats.

Still referring to FIG. 3A, when a user taps the phone with his finger or other similarly sized object (e.g., a pen or stylus), an accelerometer 330 detects the tapping and provides such information to a tap detector 332. The tap detector 332 analyzes the tapping and determines the type of tapping. For example, the tap detector 332 may determine that a single or double tap was made. The tap detector 332 transmits this information to the gesture mapper 328. The gesture mapper 328 translates the detected tapping information into its corresponding command that relates to a call feature or a voicemail review feature (the gesture mapper 328 may use the same lookup routine described above). For example, a single tap may translate into merging two calls and a double tap (two consecutive taps, one quickly following the other, for example) may translate into putting a current call on hold and answering another call on hold. The gesture mapper 328 sends the resulting command (e.g., merge two calls) to the telephony component 340 which implements the command.

Figure 4:
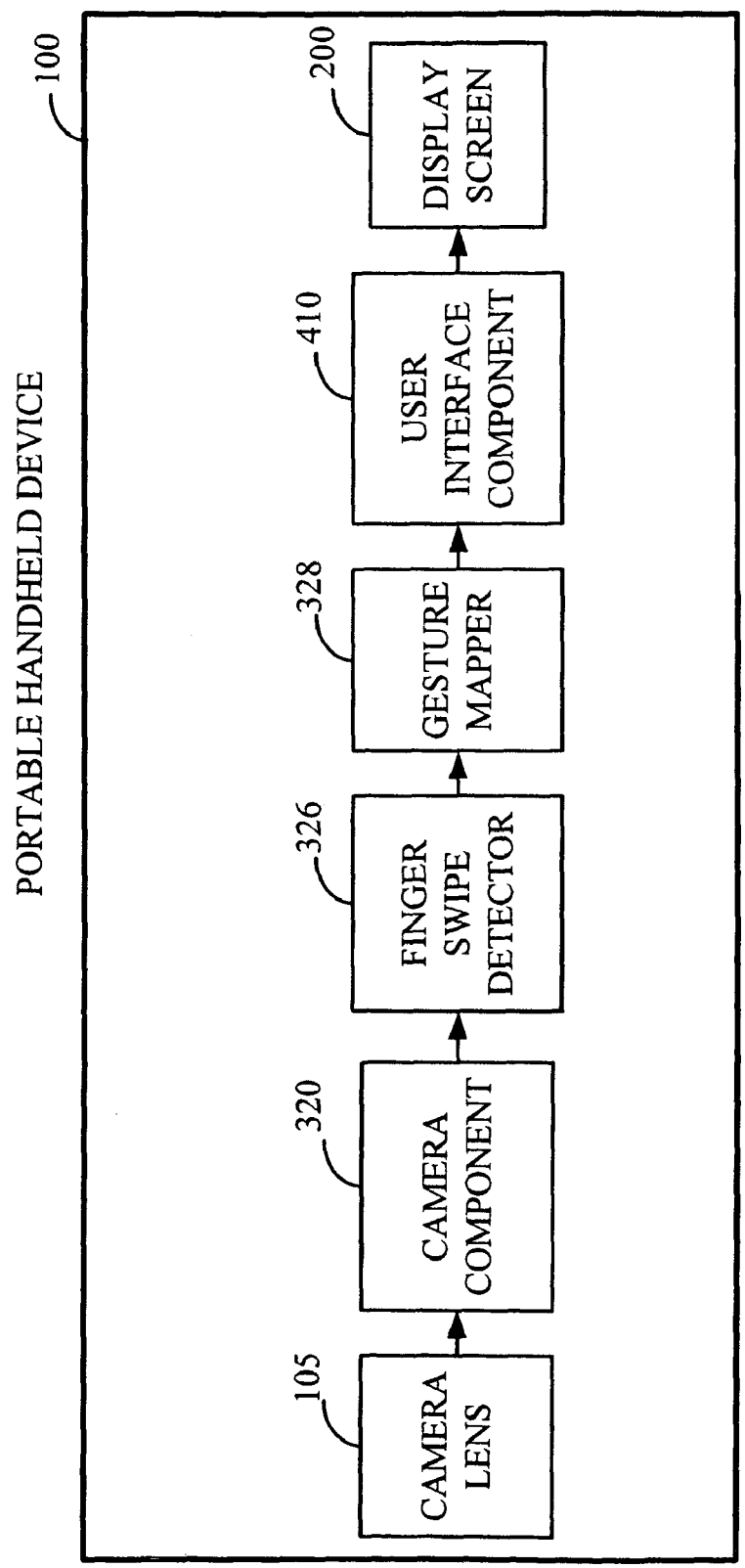
FIG. 4 is a block diagram of a portable handheld device with enhanced document navigating capabilities.

Turning now to FIG. 4, a block diagram of the portable handheld device 100 with enhanced document navigating capabilities is illustrated. Rather than touching a touch screen or pressing/scrolling buttons to navigate the view in a display, a user can now move his finger over the camera lens of the device 100 in the direction that he wishes to move the view of the display screen 200.

In this embodiment, the camera component 320 and finger swipe detector 326 may work in the same manner described above in connection with FIG. 3A, to detect the user's finger swipe motions across the camera lens. The gesture mapper 328 in this case translates the detected motion into a graphical user interface command, i.e., a corresponding movement of a handle location or scrolling operation for the display screen/document. The movement of the user's finger may be proportional to the movement of the handle location or scrolling operation of the screen 200. A user interface component 410 implements the requested movement of the handle location or scrolling operation on a display screen 200. Thus, a user can easily and quickly access and navigate all areas of the screen 200 with the same hand that holds the device 100.

Several of the above-described ways of using the built-in camera of a multi-function device may be implemented in the same device. In such a device, the detected gestures of the user are mapped to their associated commands (call or voicemail features, or display navigation) depending upon which application is active in the device at the time of detecting the gesture. For example, the device 100, and in particular the gesture mapper 328, may output voicemail commands when a voicemail application is running in the foreground. Likewise, the gesture mapper 328 may output call commands when a telephony application is running in the foreground. If the device 100 is running a web browser or other document viewer application in the foreground, then the gesture mapper 328 outputs document navigation commands. Other ways of setting the output of the gesture mapper 328 are possible, such as by detecting whether the device 100 is being held against a user's ear to indicate that the voicemail and/or telephony applications are running.

Figure 5:
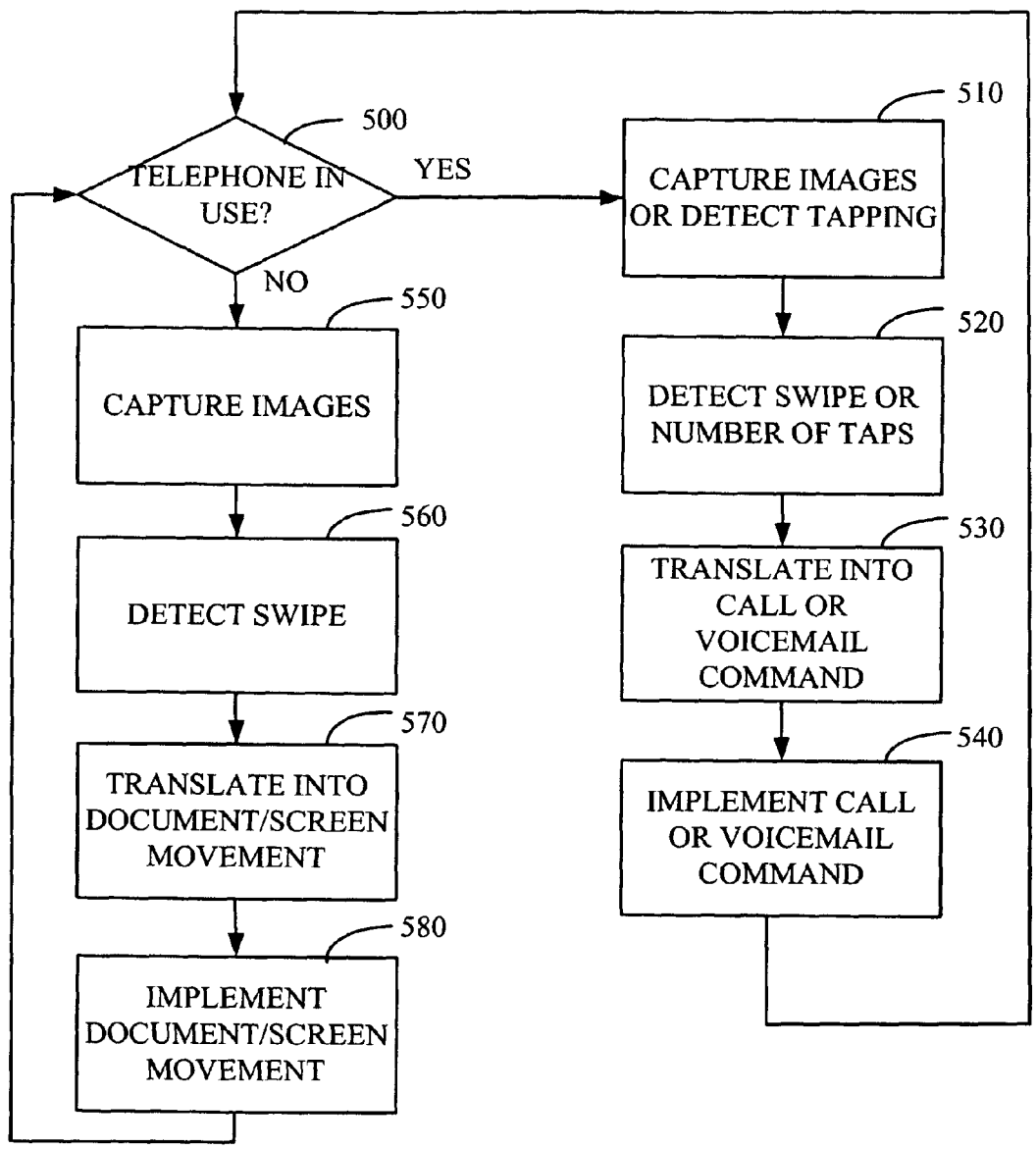
FIG. 5 illustrates a flow diagram of operations by a portable handheld device implementing user commands.
Figure 6:
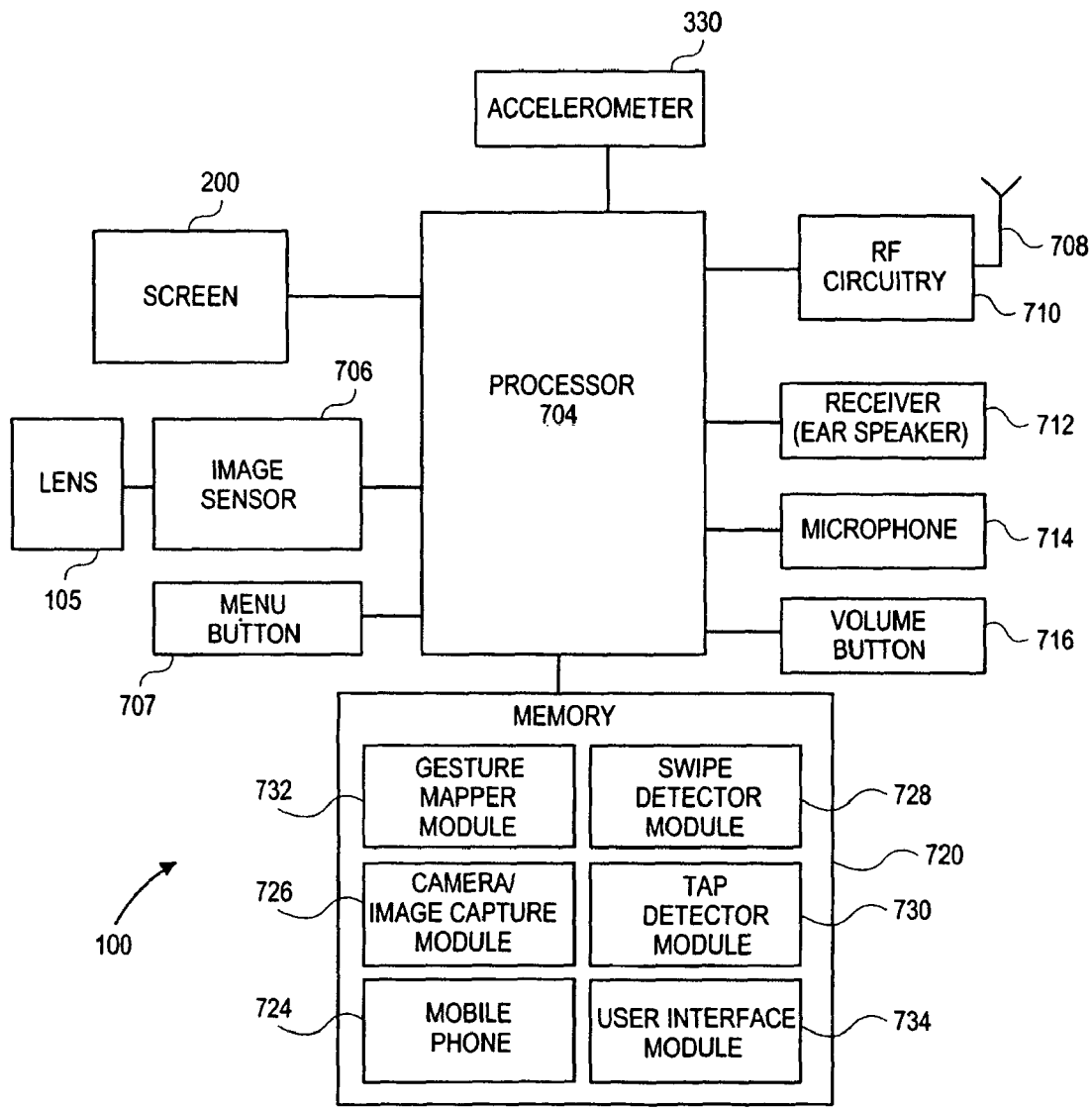
FIG. 6 depicts a block diagram of an example, portable handheld multifunction device in which an embodiment of the invention may be implemented.

FIG. 5 illustrates a flow diagram of machine-implemented operations performed by the portable handheld device as it is implementing commands, per the user's finger swipe and tapping motions. These commands are related to telephone and document navigation capabilities based on input from a camera lens or accelerometer of the device.

The device determines whether a telephone of the device is in use (operation 500). This determination may govern whether the method implements telephone/voicemail features, or document navigation features. Other ways of determining whether the user's motions should be translated into telephone/voicemail commands or screen navigation commands include detecting proximity of the screen to the user's head or position of the device (suggesting telephone/voicemail use), or simply checking which application is active or in foreground.

If the device determines that the telephone is in use (operation 500), then the device considers the user's finger swipes or tops as being directed to call or voicemail features. Depending on the motion of the user (e.g., a finger swipe or finger tap), a camera lens of the device captures images of a finger sliding over the lens or an accelerometer detects tapping of the device by the user (operation 510). At operation 520, the device detects a direction of swipe of the finger (from the images) or the number of taps made by the user. Such direction or number of taps is then translated into a call or voicemail command (operation 530). This translation or mapping can be preset in the device or customized by the user. The call or voicemail command is then implemented (operation 540). The method repeats this process for all received data of images or tapping.

If the device determines that the telephone is not in use (operation 500), then the user's motion may be translated into a display document movement. Once again, the device captures the images of a user's finger sliding across the camera lens (operation 550). From these images, the device detects the direction of swipe of the finger (operation 560). This direction is then translated into a document movement (operation 570) and implemented on the screen (operation 580). For instance, sliding the finger upwards on the lens results in moving the handle location of the document on a screen upwards, thereby raising the bottom portion of the document into view. The method repeats these acts for each swipe of the finger over the camera lens as needed.

The above explanation corresponding to FIG. 5 is directed to various actions taken by a device. The following explanation relates to certain user actions taken with respect to the portable handheld device. The actions of the user are to control call/voicemail features of the device and navigate a display screen or document of the device.

The user may be engaged in a call or is checking voicemail using the device 100, and while doing so, moves his finger over the camera lens of the device or taps the device, to signal control of voicemail message review or invoke an in-call function. The user can perform as many gestures he wishes to control these features.

The user may also be engaged in navigating a screen or document using the device 100, such as a webpage, text document, or music list, contacts list, or other similar types of lists. The user may move his finger over the camera lens to navigate the display screen/document of the device.

FIG. 7 depicts a block diagram of an example, portable handheld multifunction device in which an embodiment of the invention may be implemented. The device 100 has a processor 107 that executes instructions to carry out operations associated with the device 100. The instructions may be retrieved from memory 720 and, when executed, control the reception and manipulation of input and output data between various components of device 100. Although not shown, the memory 720 may store an operating system program that is executed by the processor 704, and one or more application programs are said to run on top of the operating system to perform different functions described below. The screen 200 displays a graphical user interface (GUI) that allows a user of the device 100 to interact with various application programs running in the device 100. The GUI displays icons or graphical images that represent application programs, files, and their associated commands on the screen 200. These may include windows, fields, dialog boxes, menus, buttons, cursors, scrollbars, etc. The user can select from these graphical images or objects to initiate the functions associated therewith.

In one embodiment, the screen 200 is a touch screen that also acts as an input device, to transfer data from the outside world into the device 100. This input is received via, for example, the user's finger touching the surface of the screen 200, but it may also be received via physical buttons on the device 100.

Still referring to FIG. 7, camera functionality of the device 100 may be enabled by the following components. A solid state image sensor 706 is built into the device 100 and may be located at a focal plane of an optical system that includes the lens 105. An optical image of a scene before the camera is formed on the image sensor 706, and the sensor 706 responds by capturing the scene in the form of a digital image or picture consisting of pixels that will then be stored in memory 720. The image sensor 706 may include a solid state image sensor chip with several options available for controlling how an image is captured.

Still referring to FIG. 7, the device 100 may operate not just in a digital camera mode, but also in a mobile telephone mode. This is enabled by the following components of the device 100. An integrated antenna 708 that is driven and sensed by RF circuitry 710 is used to transmit and receive cellular network communication signals from a nearby base station (not shown). A mobile phone application 724 executed by the processor 704 presents mobile telephony options on the screen 200 for the user, such as a virtual telephone keypad with call and end buttons. The mobile phone application 724 also controls at a high level the two-way conversation in a typical mobile telephone call, by directing a speech signal from the built-in microphone 714 to the RF circuitry, while at the same time directs a speech signal from the other side of the conversation through the receiver or ear speaker 712. The mobile phone application 724 also responds to the user's selection of the receiver volume, by detecting actuation of the physical volume button 716. Although not shown, the processor 704 may include a cellular base band processor that is responsible for much of the digital audio signal processing functions and cellular network protocol signaling associated with a cellular phone call, including encoding and decoding the voice signals of the participants to the conversation.

The device 100 may be placed in either the digital camera mode or the mobile telephone mode, in response to, for example, the user actuating a physical menu button 707 and then selecting an appropriate icon on the display device of the screen 200. In the telephone mode, the mobile phone application 724 controls loudness of the receiver 712, based on a detected actuation or position of the physical volume button 716. This use of the volume button 716 as a physical shutter button may be an alternative to a soft or virtual shutter button whose icon is simultaneously displayed on the display device of the screen 200 during camera mode.

Other elements described in FIGS. 3A and 4 may also be implemented in memory 720 in connection with a processor 704. The camera component may be implemented in a camera/image capture module 726 whose images are analyzed with a swipe detector module 728 to obtain directional reference of the swipe. The mapping of swipe directions to commands for call/voicemail features or document display navigation features involves the gesture mapper module 732 and implemented by the mobile phone 724 or user interface module 734, respectively. Tap detection described above may be implemented with a tap detector module 730 based on information from an accelerometer 330 that detects tapping. The translation of tapping to call/voicemail features may also be handled by the gesture mapper module 732.

An embodiment of the invention may be a machine-readable medium having stored thereon instructions which program a processor to perform some of the operations described above. In other embodiments, some of these operations might be performed by specific hardware components that contain hardwired logic. Those operations might alternatively be performed by any combination of programmed computer components and custom hardware components.

A machine-readable medium may include any mechanism for storing or transmitting information in a form readable by a machine (e.g., a computer), not limited to Compact Disc Read-Only Memory (CD-ROMs), Read-Only Memory (ROMs), Random Access Memory (RAM), and Erasable Programmable Read-Only Memory (EPROM).

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense.

We claim:

1. A portable electronic device comprising:
   a camera component to produce images of a scene, the camera component including a camera lens to capture images of a single finger swiping action across the camera lens;
   a finger swipe detector to determine a direction of motion of the single finger swiping action across the camera lens from the images of the single finger swiping action across the camera lens;
   a gesture mapper to translate the direction of motion into a command; and
   a telephone component to implement the command.

2. The device of claim 1, wherein the command is rewind playback of a voicemail message.

3. The device of claim 1, wherein the command is fast forward playback of a voicemail message.

4. The device of claim 1, further comprising:
   an accelerometer component to detect tapping of the device by a user; and
   a tap detector to translate the tapping into a different command.

5. The device of claim 4, wherein the different command is pause or resume playback of a voicemail message based on whether the voicemail message is paused or playing at the time of the tapping.

6. The apparatus of claim 1, wherein the command is programmable by a user of the apparatus.

7. A portable electronic device comprising:
   a camera component to produce images of a scene, the camera component including a camera lens to capture images of a single finger swiping action across the camera lens;
   a finger swipe detector to determine a direction of motion of the single finger swiping action across the camera lens from the images of the single finger swiping action across the camera lens;

an accelerometer component to detect tapping of the device;

a tap detector to determine type of the tapping;

a gesture mapper to translate the direction of motion into a first command and to translate the type of the tapping into a second command; and a telephone component to implement the first command and the second command.

8. The apparatus of claim 7, wherein the accelerometer component is to detect a first tapping and a second tapping consecutively, and wherein the telephone component is to pause playback of a voicemail message in response to the first tapping, and to resume playback of the voicemail message in response to the second tapping.

9. The apparatus of claim 7, wherein the first command is fast forward playback of a voicemail message when the direction of motion is a first direction.

10. The apparatus of claim 9, wherein the first command is rewind playback of a voicemail message when the direction of motion is a second direction, and wherein the second direction is opposite from the first direction.

11. A machine-implemented method comprising:

capturing a first plurality of images of a single finger swiping action across a camera lens and determining a direction of motion of the single finger swiping action across the camera lens from the first plurality of images of the single finger swiping action across the camera lens;

translating the direction of motion of the single finger swiping action into a first telephony or voicemail command; and implementing the first telephony or voicemail command.

12. The method of claim 11 further comprising:

detecting taps and determining therefrom a number of the taps; and translating the number of the taps into a second telephony or voicemail command.

\* \* \* \* \*